United States Patent [19]
Onishi et al.

[11] Patent Number: 6,160,293
[45] Date of Patent: Dec. 12, 2000

[54] SUB-QUARTER MICRON SILICON-ON-INSULATOR MOS FIELD EFFECT TRANSISTOR WITH DEEP SILICIDE CONTACT LAYERS

[75] Inventors: Hideaki Onishi; Kiyotaka Imai, both of Tokyo, Japan

[73] Assignee: NEC Corporation, Tokyo, Japan

[21] Appl. No.: 09/176,914

[22] Filed: Oct. 22, 1998

[51] Int. Cl.$^7$ .................................................. H01L 29/00
[52] U.S. Cl. ...................... 257/347; 257/213; 257/288.7; 257/316; 257/377; 257/382; 257/383; 257/384
[58] Field of Search .................................. 257/347–355, 257/757, 213, 382–384, 377, 316, 288

[56] References Cited

U.S. PATENT DOCUMENTS 5,883,396  3/1999  Reedy et al. .............................. 257/280

FOREIGN PATENT DOCUMENTS

| 2-96375 | 4/1990 | Japan . |
| 5-315355 | 11/1993 | Japan . |
| 8-250739 | 9/1996 | Japan . |
| 8-288386 | 11/1996 | Japan . |

OTHER PUBLICATIONS

N. Kistler et al., "Sub–Quarter–Micrometer CMOS on Ultra–thin (400 Å) SOI", pp. 235–237, IEEE Electron Device Letters, vol. 13, No. 5, May 1992.

K. Azuma et al., "Application of Ti Salicide Process on Ultra–thin SIMOX Wafer", pp. 30–31, Proceedings 1995 IEEE International SOI Conference, Oct. 1995.

*Primary Examiner*—Fetsum Abraham
*Attorney, Agent, or Firm*—Young & Thompson

[57] ABSTRACT

A semiconductor thin film structure includes source/drain regions and a channel region positioned between the source/drain regions. The semiconductor thin film structure extends directly on and in contact with a surface of an insulation region. At least one of the source/drain regions includes a semiconductor material region extending directly over and in contact with the surface of the insulation region and a refractory metal silicide layer extending directly on and in contact with the semiconductor material region. The refractory metal silicide layer has a first thickness which is equal to or thicker than a half of a second thickness of the channel region, thereby suppressing any substantive kink effect. The first thickness of the refractory metal silicide layer is also thinner than a third thickness of the source/drain regions, so that at least a majority part of a bottom surface of the refractory metal silicide layer has a junction interface with the semiconductor material region of the source/drain regions, thereby reducing a parasitic resistance of the source and drain regions.

14 Claims, 7 Drawing Sheets

SUB-QUARTER MICRON SILICON-ON-INSULATOR MOS FIELD EFFECT TRANSISTOR WITH DEEP SILICIDE CONTACT LAYERS

BACKGROUND OF THE INVENTION

The present invention relates to a semiconductor device, and more particularly to a silicon-on-insulator semiconductor device.

The silicon-on-insulator semiconductor device is attractive as being capable of easy isolation to devices and latch-up free as well as reduction in junction capacity of source and drain. If, however, a MOS field effect transistor is formed on an ultrathin silicon-on-insulator film having a thickness of not more than 50 nanometers, resistances of the source and drain of the MOS field effect transistor are extremely high, for which reason it is necessary to reduce the resistances of the source and drain of the MOS field effect transistor. In order to reduce the resistances of the source and drain of the MOS field effect transistor, it is effective to form refractory metal silicide layers such as titanium silicide layers in the source and drain regions of the MOS field effect transistor.

FIG. 1 is a fragmentary cross sectional elevation view illustrative of a conventional MOS field effect transistor having titanium silicide layers formed on a silicon-on-insulator thin film. A buried oxide film 2 as an insulator is formed on a silicon substrate 1. A silicon-on-insulator film is formed on the buried oxide film 2, wherein the silicon-on-insulator film comprises a p⁻-type layer 3 and n+-type layers 7 positioned opposite sides of the p⁻-type layer 3. An upper region of the p⁻-type layer 3 in the siliconon-insulator film serves as a channel region. The n+-type layers 7 in the silicon-on-insulator film serve as source and drain regions. A gate oxide film 4 is provided on the p⁻-type layer 3 in the silicon-on-insulator film. A polysilicon gate electrode 5 is provided on the gate oxide film 4. Titanium silicide layers 8 are provided in upper regions of the polysilicon gate electrode 5 and the source and drain regions of the n+-type layers 7. Side wall oxide films 6 are provided on opposite side walls of the polysilicon gate electrode 5 and the titanium silicide layer 8 on the polysilicon gate electrode 5. Under the side wall oxide films 6, the titanium silicide layers 8 do not extend.

The above MOS field effect transistor on the silicon-on-insulator film may be formed as follows-The silicon-on-insulator film having the predetermined thin thickness is formed on the buried oxide layer 2 by a mesa isolation technique. The silicon-on-insulator film is divided into the p⁻-type layer 3 and the n+-type layers 7 by selective ion-implantations of p-type and n-type impurities. The gate oxide film 4 is formed on the p⁻-type layer 3. An impurity doped polysilicon layer is formed over the silicon-on-insulator film before the impurity doped polysilicon layer is then patterned to define the polysilicon gate electrode 5. A silicon oxide film is then deposited by a chemical vapor deposition so that the silicon oxide film extends over the polysilicon gate electrode 5 and the n+-type layers 7 in the silicon-on-insulator film. An anisotropic etching to the silicon oxide film is carried out to leave the silicon oxide film only on opposite side walls of the polysilicon gate electrode 5, thereby forming the side wall oxide films 6. A titanium layer having a predetermined thickness is deposited entirely over the polysilicon gate electrode 5, the side wall oxide films 6 and the n+-type layers 7 in the silicon-on-insulator film by sputtering a titanium target. The titanium film is then subjected to a high temperature annealing at about 700° C. in an inert gas atmosphere such as a nitrogen atmosphere to cause a selective silicidation reaction of titanium with silicon over the polysilicon gate electrode 5 and the n+-type layers 7 in the silicon-on-insulator film, whereby C49-structured titanium silicide layers 8 are selectively formed on the polysilicon gate electrode 5 and the n+-type layers 7 in the silicon-on-insulator film, whilst titanium nitride layers are formed over the buried oxide layer 2 and the side wall oxide films 6. The titanium nitride layers are removed by a wet etching. The C49-structured titanium silicide layers 8 are then subjected to a second heat treatment at about 800° C. in an inert gas atmosphere such as a nitrogen atmosphere to cause a phase transition from C49-crystal structure into C54-crystal structure, whereby C54-structured titanium silicide layers 8 are formed in the upper regions of the polysilicon gate electrode 5 and the n+-type layers 7 in the silicon-on-insulator film.

In Proceedings 1995 IEEE International SOI Conference, October 1995, pp. 30–31, there is disclosed one of the above MOS field effect transistors formed on the silicon-on-insulator. FIG. 2 is a fragmentary cross sectional elevation view illustrative of a first type of the conventional MOS field effect transistor having titanium silicide layers formed on a silicon-on-insulator thin film, wherein titanium silicide layers have a thickness of 20 nanometers whilst a silicon-on-insulator has a thickness of 50 nanometers. The titanium silicide layers 8 are thinner than n+-type silicon layers 7 under the titanium silicide layers 8. Namely, a buried oxide film 2 as an insulator is formed on a silicon substrate 1. A silicon-on-insulator film is formed on the buried oxide film 2, wherein the silicon-on-insulator film comprises a p⁻-type layer 3 and n+-type layers 7 positioned opposite sides of the p⁻-type layer 3. An upper region of the p⁻-type layer 3 in the silicon-on-insulator film serves as a channel region. The n+-type layers 7 in the silicon-on-insulator film serve as source and drain regions. A gate oxide film 4 is provided on the p⁻-type layer 3 in the silicon-on-insulator film. A polysilicon gate electrode 5 is provided on the gate oxide film 4. Titanium silicide layers 8 arc provided in upper regions of the polysilicon gate electrode 5 and the source and drain regions of the n+-type layers 7. Side wall oxide films 6 are provided on opposite side walls of the polysilicon gate electrode 5 and the titanium silicide layer 8 on the polysilicon gate electrode 5. Under the side wall oxide films 6, the titanium silicide layers 8 do not extend. The silicide layers 8 have a thickness of 20 nanometers whilst the silicon-on-insulator has a thickness of 50 nanometers. The n+-type silicon layers 7 under the titanium silicide layers 8 have a thickness of 30 nanometers. For those reasons, the titanium silicide layers 8 are thinner than n+-type silicon layers 7 under the titanium silicide layers 8.

The above first type of the conventional MOS field effect transistor formed on the silicon-on-insulator substrate has such a structural feature that the titanium silicide layers 8 are thinner than n+-type silicon layers 7 under the titanium silicide layers 8. In this case, an impurity concentration of the channel region is so set as to suppress short channel effects of sub-quarter micron order devices. FIG. 3 is a diagram illustrative of drain current-drain voltage characteristics of the first type conventional MOS field effect transistor applied with various gate voltages of 2.5V, 2.0V, 1.5V, 1.0V and 0.5V. FIG. 3 shows that kink effects appear on the drain current-drain voltage characteristics of the first type conventional MOS field effect transistor. Those kink effects cause remarkable increases in distortion of the device operations. The silicon-on-insulator structure electrically isolates or floats the MOS field effect transistor from the semiconductor substrate, for which reason the increase in drain current of the MOS field effect transistor causes a generation of electron-hole pairs due to impact ionization of carriers under a highly concentrated field at a junction between the drain and channel regions of the MOS field effect transistor. The electrons generated are absorbed into the drain whilst a part of the generated holes is absorbed into the source. Notwithstanding, the remaining holes are accumulated in the channel region. This accumulation of the holes in the channel region causes an increase in potential of the channel region, whereby a threshold voltage of the MOS field effect transistor is dropped. This drop in threshold voltage of the MOS field effect transistor causes rapid increase in the drain current of the MOS field effect transistor at a drain voltage. This rapid increase in the drain current is the result of the kink effect. Every drain current-drain voltage characteristics of the first type conventional MOS field effect transistor applied with various gate voltages of 2.5V, 2.0V, 1.5V, 1.0V and 0.5V show the kink effects.

In IEEE Electron Device Letters, Vol. 13, No. 5, May 1992, pp. 235–237, there is disclosed a second type of the above conventional MOS field effect transistor formed on the silicon-on-insulator. FIG. 4 is a fragmentary cross sectional elevation view illustrative of a second type of the conventional MOS field effect transistor having titanium silicide layers formed on a silicon-on-insulator thin film, wherein source and drain regions in a silicon-on-insulator layer are completely and entirely silicided so that the source and drain regions comprise titanium silicide layers having a thickness of 40 nanometers and the titanium silicide layers as the source and drain regions are in contact directly with the buried oxide layer which electrically isolates the silicon-on-insulator from the semiconductor substrate. Namely, a buried oxide film 2 as an insulator is formed on a silicon substrate 1. A silicon-on-insulator film is formed on the buried oxide film 2, wherein the silicon-on-insulator film comprises a p$^-$-type layer 3, n+-type layers 7 positioned opposite sides of the p$^-$-type layer 3 and titanium silicide layers 8-1 positioned opposite sides of the n+-type layers 7. An upper region of the p$^-$-type layer 3 in the silicon-on-insulator film serves as a channel region. A gate oxide film 4 is provided on the p$^-$-type layer 3 in the silicon-on-insulator film. A polysilicon gate electrode 5 is provided on the gate oxide film 4. Side wall oxide films 6 are provided on opposite side walls of the polysilicon gate electrode 5 and the titanium silicide layer 8 on the polysilicon gate electrode 5. Under the side wall oxide films 6, the n+-type layers 7 are positioned. A titanium silicide film 8-2 is provided in an upper region of the polysilicon gate electrode 5. The titanium silicide layers 8-1 and 8-2 have a thickness of 40 nanometers which is the same as the silicon-on-insulator layer, whereby the titanium silicide layers 8-1 of the source and drain regions are in contact directly with the buried oxide layer 2. Namely, the source and drain regions in the silicon-on-insulator layer are completely and entirely silicided.

The above second type of the conventional MOS field effect transistor formed on the silicon-on-insulator substrate has such a structural feature that the source and drain regions in the silicon-on-insulator layer are completely and entirely silicided so that the source and drain regions comprise the titanium silicide layers 8-1. In this case, the drain current in the drain current-drain voltage characteristic is reduced by a parasitic resistance of the second type conventional MOS field effect transistor. FIG. 5 is a diagram illustrative of drain current-drain voltage characteristics of the second type conventional MOS field effect transistor applied with various gate voltages of 2.5V, 2.0V, 1.5V, 1.0V and 0.5V. FIG. 5 shows that the drain currents in the drain current-drain voltage characteristics of the second type conventional MOS field effect transistor applied with the various gate voltages of 2.5V, 2.0V, 1.5V, 1.0V and 0.5V are reduced by the parasitic resistance of the second type conventional MOS field effect transistor. These reductions in the drain currents in the drain current-drain voltage characteristics of the second type conventional MOS field effect transistor results in remarkable deteriorations of the high speed performances of the second type conventional MOS field effect transistor Namely, the titanium silicide layers 8-1 are in contact directly with the n+-type regions 7 but only on a section area of the silicon-on-insulator layer, whereby junction areas between the n+-type regions 7 and the titanium silicide layers 8-1 are small and limited into the section area of the silicon-on-insulator layer. This small junction areas between the n+-type regions 7 and the titanium silicide layers 8-1 cause increases in contact resistances between the n+-type regions 7 and the titanium silicide layers 8-1. This increment of the contact resistances between the n+-type regions 7 and the titanium silicide layers 8-1 appears as the parasitic resistance.

In the above circumstances, it had been required to develop a novel silicide layer structure in an ultrathin silicon-on-insulator layer for a silicon-on-insulator sub-quarter micron order MOS field effect transistor, which is free from the above problems.

SUMMARY OF THE INVENTION

Accordingly, it is an object of the present invention to provide a novel silicide layer structure in an ultrathin silicon-on-insulator layer for a silicon-on-insulator sub-quarter micron order MOS field effect transistor, which is free from the above problems.

It is a further object of the present invention to provide a novel silicide layer structure in an ultrathin silicon-on-insulator layer for a silicon-on-insulator sub-quarter micron order MOS field effect transistor, which permits the sub-quarter micron order MOS field effect transistor to exhibit high speed best performances.

It is a still further object of the present invention to provide a novel silicide layer structure in an ultrathin silicon-on-insulator layer for a silicon-on-insulator sub-quarter micron order MOS field effect transistor, which is capable of suppressing any substantive kink effect of the sub-quarter micron order MOS field effect transistor.

It is yet a further object of the present invention to provide a novel silicide layer structure in an ultrathin silicon-on-insulator layer for a silicon-on-insulator sub-quarter micron order MOS field effect transistor, which is capable of reducing in parasitic resistance of source and drain regions of the sub-quarter micron order MOS field effect transistor.

It is a further object of the present invention to provide a novel ultrathin silicon-on-insulator layer structure having silicide layers for a silicon-on-insulator sub-quarter micron order MOS field effect transistor, which is free from the above problems.

It is a still further object of the present invention to provide a novel ultrathin silicon-on-insulator layer structure having silicide layers for a silicon-on-insulator sub-quarter micron order MOS field effect transistor, which permits the sub-quarter micron order MOS field effect transistor to exhibit high speed best performances.

It is moreover an object of the present invention to provide a novel ultrathin silicon-on-insulator layer structure having silicide layers for a silicon-on-insulator sub-quarter micron order MOS field effect transistor, which is capable of suppressing any substantive kink effect of the sub-quarter micron order MOS field effect transistor.

It is another object of the present invention to provide a novel ultrathin silicon-on-insulator layer structure having silicide layers for a silicon-on-insulator sub-quarter micron order MOS field effect transistor, which is capable of reduction in parasitic resistance of source and drain regions of the sub-quarter micron order MOS field effect transistor.

It is still another object of the present invention to provide a novel ultrathin silicon-on-insulator layer structure having silicide layers for a silicon-on-insulator sub-quarter micron order semiconductor device, which is free from the above problems.

It is yet another object of the present invention to provide a novel ultrathin silicon-on-insulator layer structure having silicide layers for a silicon-on-insulator sub-quarter micron order semiconductor device, which permits the sub-quarter micron order semiconductor device to exhibit high speed best performances.

It is further another object of the present invention to provide a novel ultrathin silicon-on-insulator layer structure having silicide layers for a silicon-on-insulator sub-quarter micron order semiconductor device, which is capable of suppressing any substantive link effect of the sub-quarter micron order semiconductor device.

It is an additional object of the present invention to provide a novel ultrathin silicon-on-insulator layer structure having silicide layers for a silicon-on-insulator sub-quarter micron order semiconductor device, which is capable of reduction in parasitic resistance of source and drain regions of the sub-quarter micron order semiconductor device.

It is a still additional object of the present invention to provide a novel semiconductor device having a sub-quarter micron order silicon-on-insulator structure having silicide layers, which is free from the above problems.

It is yet an additional object of the present invention to provide a novel semiconductor device having a sub-quarter micron order silicon-on-insulator structure having silicide layers, which permits the semiconductor device to exhibit high speed best performances.

It is a further additional object of the present invention to provide a novel semiconductor device having a sub-quarter micron order silicon-on-insulator structure having silicide layers, which is capable of suppressing any substantive kink effect of the semiconductor device.

It is also additional object of the present invention to provide a novel semiconductor device having a sub-quarter micron order silicon-on-insulator structure having silicide layers, which is capable of reduction in parasitic resistance of source and drain regions of the semiconductor device.

The present invention provides a semiconductor thin film structure comprising source/drain regions and a channel region positioned between the source/drain regions. The semiconductor thin film structure extends directly on and in contact with a surface of an insulation region. At least one of the source/drain regions comprises a semiconductor material region extending directly over and in contact with the surface of the insulation region and a refractory metal silicide layer extending directly on and in contact with the semiconductor material region. It is important for the first present invention that the refractory metal silicide layer has a first thickness which is nearly equal to or thicker than a half of a second thickness of the channel region, thereby suppressing any substantive kink effect. It is also important for the first present invention that the first thickness of the refractory metal silicide layer is further thinner than a third thickness of the at least one of the source/drain regions, so that at least a majority part of a bottom surface of the refractory metal silicide layer has a junction interface with the semiconductor material region of the at least one of the source/drain regions, thereby reducing a parasitic resistance of the source and drain regions.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
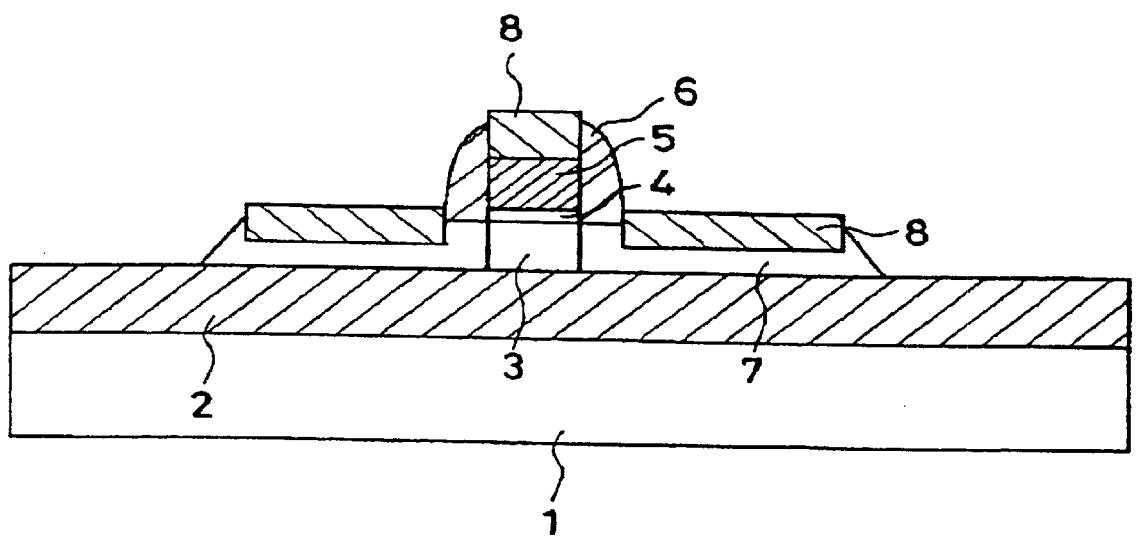
FIG. 1 is a fragmentary cross sectional elevation view illustrative of a first conventional MOS field effect transistor having titanium silicide layers formed on a silicon-on-insulator thin film.
Figure 2:
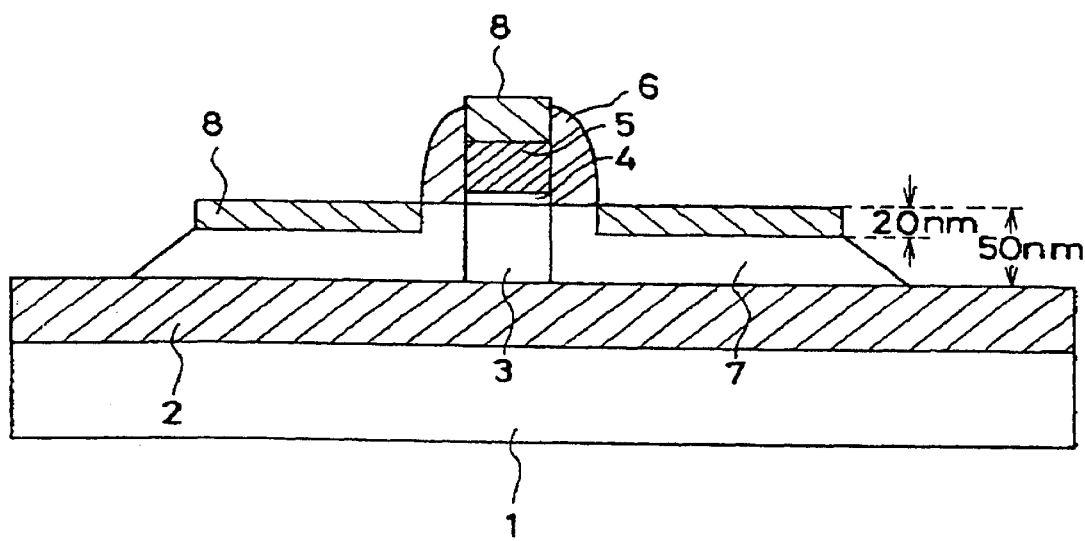
FIG. 2 is a fragmentary cross sectional elevation view illustrative of a first type of the conventional MOS field effect transistor having titanium silicide layers formed on a silicon-on-insulator thin film, wherein titanium silicide layers have a thickness of 20 nanometers whilst a silicon-on-insulator has a thickness of 50 nanometers.
Figure 3:
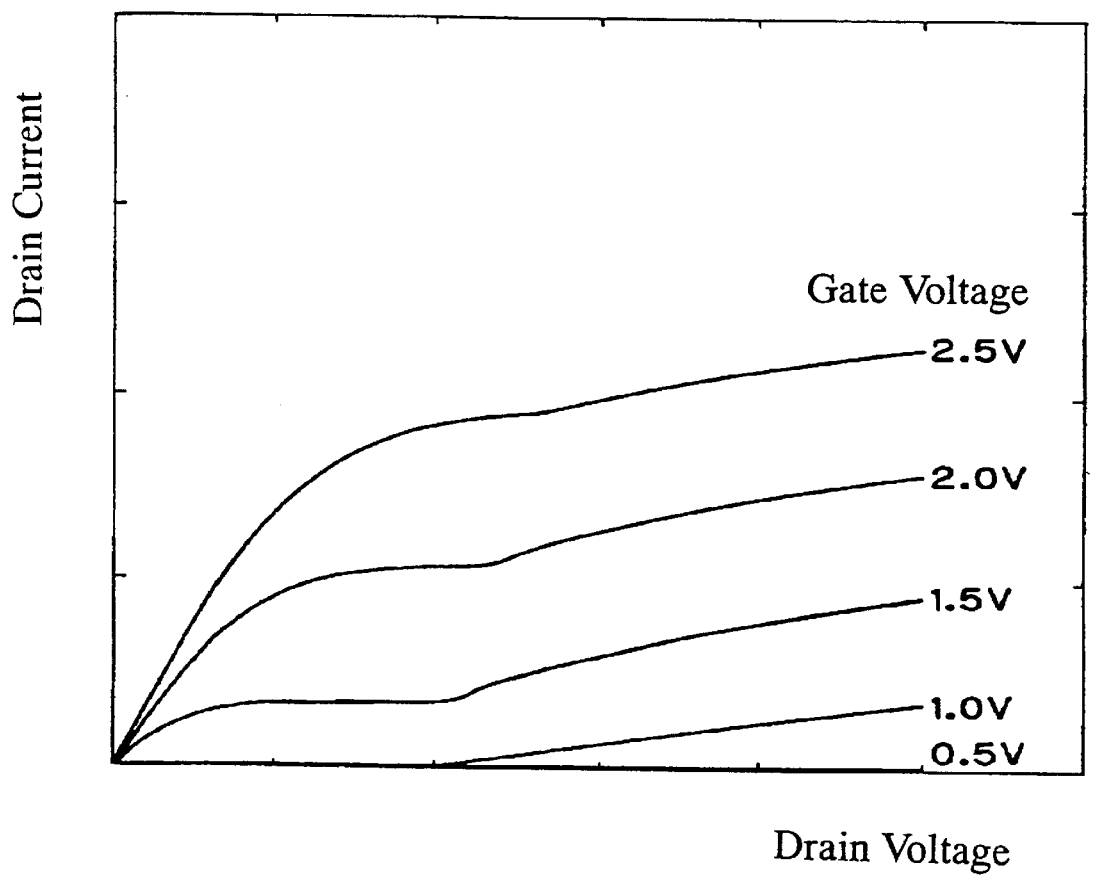
FIG. 3 is a diagram illustrative of drain current-drain voltage characteristics of the first type conventional MOS field effect transistor applied with various gate voltages of 2.5V, 2.0V, 1.5V, 1.0V and 0.5V
Figure 4:
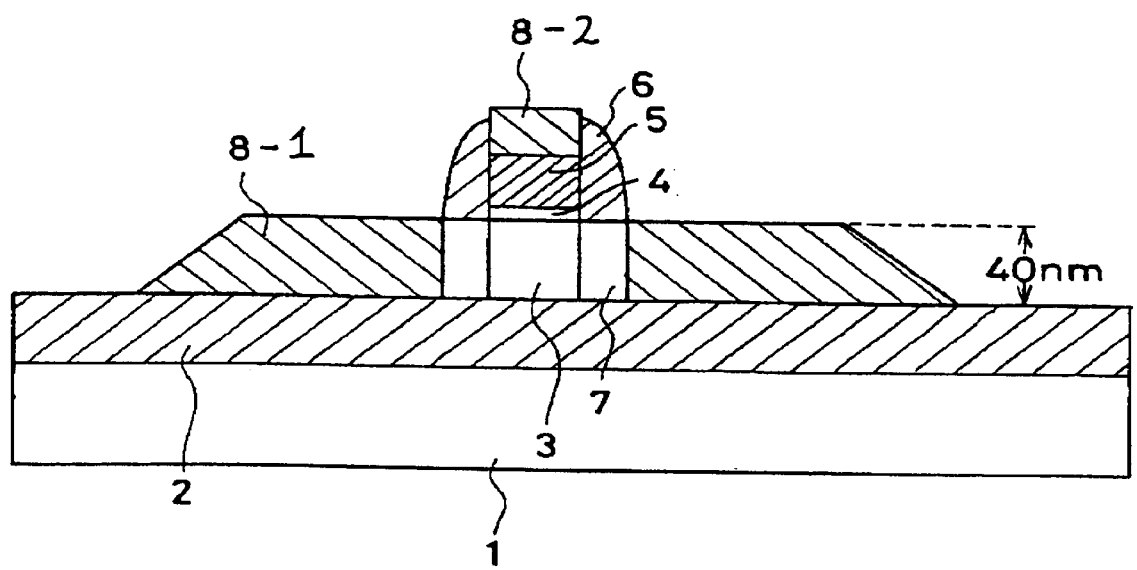
FIG. 4 is a fragmentary cross sectional elevation view illustrative of a second type of the conventional MOS field effect transistor having titanium silicide layers formed on a silicon-on-insulator thin film, wherein source and drain regions in a silicon-on-insulator layer are completely and entirely silicided.
Figure 5:
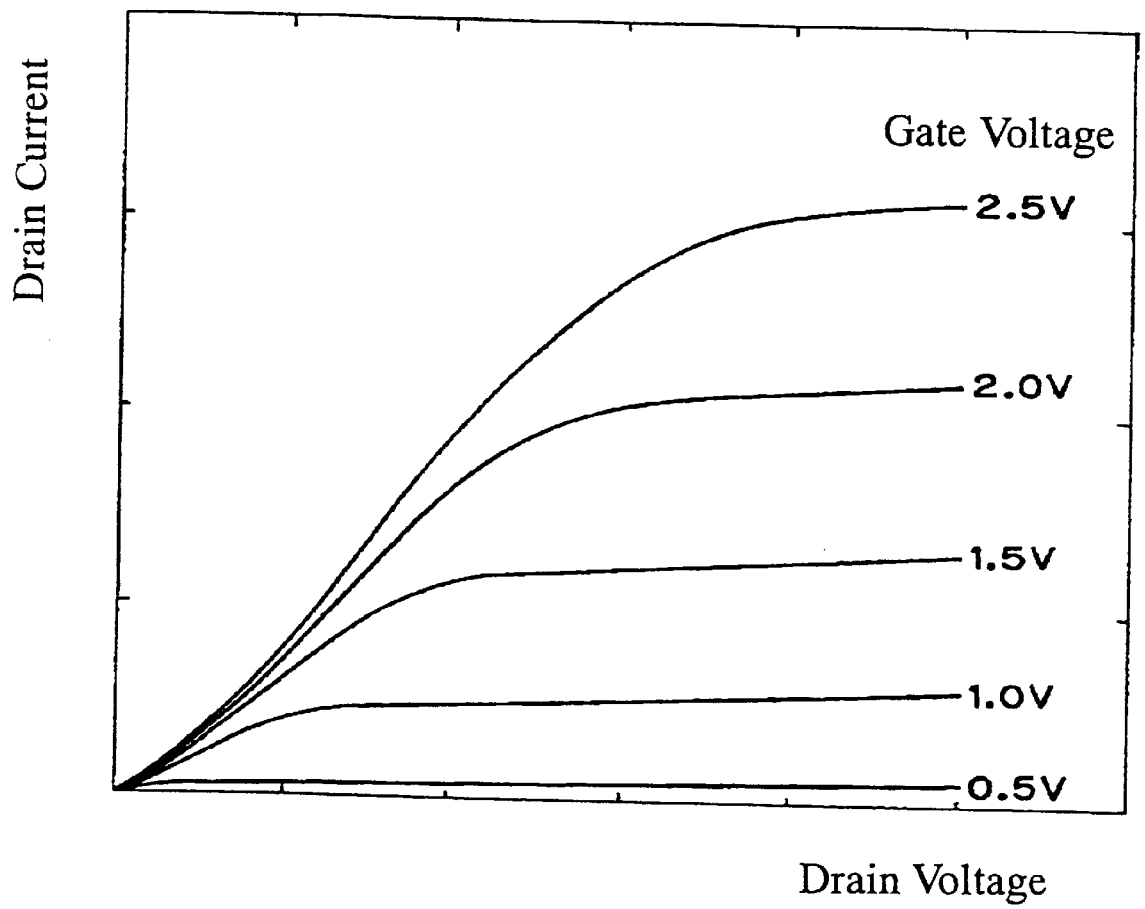
FIG. 5 is a diagram illustrative of drain current-drain voltage characteristics of the second type conventional MOS field effect transistor applied with various gate voltages of 2.5V, 2.0V, 1.5V, 1.0V and 0.5V.

The first aspect of the present invention provides a semiconductor thin film structure comprising source/drain regions and a channel region positioned between the source/drain regions. The semiconductor thin film structure extends directly on and in contact with a surface of an insulation region. At least one of the source/drain regions comprises a semiconductor material region extending directly over and in contact with the surface of the insulation region and a refractory metal silicide layer extending directly on and in contact with the semiconductor material region. It is important for the first present invention that the refractory metal silicide layer has a first thickness which is nearly equal to or thicker than a half of a second thickness of the channel region, thereby suppressing any substantive kink effect. It is also important for the first present invention that the first thickness of the refractory metal silicide layer is further thinner than a third thickness of the at least one of the source/drain regions, so that at least a majority part of a bottom surface of the refractory metal silicide layer has a junction interface with the semiconductor material region of the at least one of the source/drain regions, thereby reducing a parasitic resistance of the source and drain regions.

Practically, it is not so easy to form a highly abrupt and exactly flat junction interface between the refractory metal silicide layer and the semiconductor material region by a silicidation reaction, for which reason the formed junction interface between the refractory metal silicide layer and the semiconductor material region might not have an extremely high abruptness and an exact flatness. In this case, the first thickness of the refractory metal silicide layer may be defined to be an averaged thickness. Even if a minority part of the bottom surface of the refractory metal silicide layer is in contact with the insulation region, then it is possible to obtain a sufficient reduction in parasitic resistance of the at least one of the source/drain regions, provided that at least the majority part of the bottom surface of the refractory metal silicide layer has a junction interface with the semiconductor material region of the at least one of the source/drain regions thereby ensuring a sufficiently large area of the junction interface. Needless to say, however, it is preferable that an entire part of the bottom surface of the refractory metal silicide layer has a junction interface with the semiconductor material region of the at least one of the source/drain regions.

The refractory metal silicide layer acts to promote drawings of second conductivity type carriers, for example, holes from the channel region, wherein the refractory metal silicide provides recombination centers for the first conductivity type carriers, for example, electrons and the second conductivity type carriers, for example, holes, when the second conductivity type carriers, for example, holes flow between the source/drain regions through the channel region. It was confirmed that, contrary to the first aspect of the present invention, if the thickness of the refractory metal silicide layer is less than about a half of the thickness of the channel region, then the efficiency of drawings of the second conductivity type carriers, for example, holes from the channel region is low, whereby the second conductivity type carriers, for example, holes are likely to be accumulated in the channel region, resulting in an appearance of the kink effect. If, in accordance with the first aspect of the present invention, the thickness of the refractory metal silicide layer is not less than about a half of the thickness of the channel region, then the efficiency of drawings of the second conductivity type carriers, for example, holes from the channel region is much higher than the above case, whereby the second conductivity type carriers, for example, holes are likely to be drawn from the channel region, resulting in no appearance of the kink effect.

Further, in accordance with the first aspect of the present invention, at least the majority part of the bottom surface of the refractory metal silicide layer has a junction interface with the semiconductor material region of the at least one of the source/drain regions, thereby ensuring a sufficiently large area of the junction interface. It is of course preferable that an entire part of the bottom surface of the refractory metal silicide layer has the junction interface with the semiconductor material region of the at least one of the source/drain regions. The sufficiently large area of the junction interface results in the reduction in parasitic resistance of the at least one of the source/drain regions. The reduction in parasitic resistance of the at least one of the source/drain regions allows the device to exhibit high speed best performances.

The second and third thickness may be not larger than about 50 nanometers to realize a sub-quarter micron sized device. The above first aspect of the present invention is, of course, applicable to smaller size semiconductor device or thinner thickness semiconductor film than the sub-quarter micron sized device if required in future.

The second and third thickness may be the same as each other to form the sub-quarter micron semiconductor thin film having a substantially uniform thickness. In this case, it is essential that the first thickness of the refractory metal silicide layer is nearly equal to or thicker than a half of the second thickness of the channel region, thereby suppressing any substantive kink effect, and also that the first thickness of the refractory metal silicide layer is further thinner than the third thickness of the at least one of the source/drain regions, so that at least the majority part of a bottom surface of the refractory metal silicide layer has the junction interface with the semiconductor material region of the at least one of the source/drain regions, thereby reducing the parasitic resistance of the source and drain regions.

The second and third thickness may also be different from each other. The source and drain regions may optionally be formed to be thicker than the channel region. In this case, it is essential that the first thickness of the refractory metal silicide layer is nearly equal to or thicker than a half of the second thickness of the channel region, thereby suppressing any substantive kink effect, and also that the first thickness of the refractory metal silicide layer is further thinner than the third thickness of the at least one of the source/drain regions, so that at least the majority part of a bottom surface of the refractory metal silicide layer has the junction interface with the semiconductor material region of the at least one of the source/drain regions, thereby reducing the parasitic resistance of the source and drain regions.

The semiconductor thin film structure may comprise a single crystal silicon film to form a silicon-on-insulator structure. In this case, the above first present invention may, for example, be applicable to a silicon-on-insulator MOS field effect transistor.

The semiconductor thin film structure may comprise a polycrystal silicon film. In this case, the above first aspect of the present invention may, for example, be applicable to a silicon-on-insulator thin film transistor.

The above refractory metal silicide layer may include at least any one of refractory metals, for example, titanium, cobalt and nickel.

The second aspect of the present invention provides a semiconductor thin film structure comprising first and second regions of a first conductive type and a second region of a second conductivity type positioned between the first and second regions. The semiconductor thin film structure extends directly on and in contact with a surface of an insulation region. At least one of the first and second regions comprises a semiconductor material region extending directly over and in contact with the surface of the insulation region and a refractory metal silicide layer extending directly on and in contact with the semiconductor material region. It is important for the second present invention that the refractory metal silicide layer has a first thickness which is nearly equal to or thicker than a half of a second thickness of the third region. It is also important for the second present invention that the first thickness of the refractory metal silicide layer is further thinner than a third thickness of the at least one of the first and second regions, so that at least a majority part of a bottom surface of the refractory metal silicide layer has a junction interface with the semiconductor material region of the at least one of the first and second regions, thereby reducing a parasitic resistance of the first and second regions.

Practically, it is not so easy to form a highly abrupt and exactly flat junction interface between the refractory metal silicide layer and the semiconductor material region by a silicidation reaction, for which reason the formed junction interface between the refractory metal silicide layer and the semiconductor material region might not have an extremely high abruptness and an exact flatness. In this case, the first thickness of the refractory metal silicide layer may be defined to be an averaged thickness. Even if a minority part of the bottom surface of the refractory metal silicide layer is in contact with the insulation region, then it is possible to obtain a sufficient reduction in parasitic resistance of the at least one of the first and second regions, provided that at least the majority part of the bottom surface of the refractory metal silicide layer has a junction interface with the semiconductor material region of the at least one of the first and second regions thereby ensuring a sufficiently large area of the junction interface. Needless to say, however, it is preferable that an entire part of the bottom surface of the refractory metal silicide layer has a junction interface with the semiconductor material region of the at least one of the first and second regions.

The refractory metal silicide layer acts to promote drawings of second conductivity type carriers, for example, holes from the third region, wherein the refractory metal silicide provides recombination centers for the first conductivity type carriers, for example, electrons and the second conductivity type carriers, for example, holes, when the second conductivity type carriers, for example, holes flow between the first and second regions through the third region. It was confirmed that, contrary to the second present invention, if the thickness of the refractory metal silicide layer is less than about a half of the thickness of the third region, then the efficiency of drawings of the second conductivity type carriers, for example, holes from the third region is low, whereby the second conductivity type carriers, for example, holes are likely to be accumulated in the third region, resulting in an appearance of the kink effect. If, in accordance with the second present invention, the thickness of the refractory metal silicide layer is not less than about a half of the thickness of the channel region, then the efficiency of drawings of the second conductivity type carriers, for example, holes from the third region is much higher than the above case, whereby the second conductivity type carriers, for example, holes are likely to be drawn from the third region, resulting in no appearance of the kink effect.

Further, in accordance with the second aspect of the present invention, at least the majority part of the bottom surface of the refractory metal silicide layer has a junction interface with the semiconductor material region of the at least one of the first and second regions, thereby ensuring a sufficiently large area of the junction interface. It is of course preferable that an entire part of the bottom surface of the refractory metal silicide layer has the junction interface with the semiconductor material region of the at least one of the first and second regions. The sufficiently large area of the junction interface results in the reduction in parasitic resistance of the at least one of the first and second regions. The reduction in parasitic resistance of the at least one of the first and second legions allows the device to exhibit high speed best performances.

It is available that the second and third thickness are not larger than about 50 nanometers to realize a sub-quarter micron sized device. The above second present invention is, of course, applicable to smaller size semiconductor device or thinner thickness semiconductor film than the sub-quarter micron sized device if required in future.

It is also available that the second and third thickness are the same as each other to form the sub-quarter micron semiconductor thin film having a substantially uniform thickness. In this case, it is essential that the first thickness of the refractory metal silicide layer is nearly equal to or thicker than a half of the second thickness of the channel region, thereby suppressing any substantive kink effect, and also that the first thickness of the refractory metal silicide layer is further thinner than the third thickness of the at least one of the source/drain regions, so that at least the majority part of a bottom surface of the refractory metal silicide layer has the junction interface with the semiconductor material region of the at least one of the source/drain regions, thereby reducing the parasitic resistance of the first and second regions.

It is also available that the second and third thickness are different from each other. The first and second regions may optionally be formed to be thicker than the third region positioned between the first and second regions. In this case, it is essential that the first thickness of the refractory metal silicide layer is nearly equal to or thicker than a half of the second thickness of the third region, thereby suppressing any substantive kink effect, and also that the first thickness of the refractory metal silicide layer is further thinner than the third thickness of the at least one of the first and second regions, so that at least the majority part of a bottom surface of the refractory metal silicide layer has the junction interface with the semiconductor material region of the at least one of the first and second regions, thereby reducing the parasitic resistance of the first and second regions.

It is also available that the semiconductor thin film structure comprises a single crystal silicon film to form a silicon-on-insulator structure. In this case, the above second present invention may, for example, be applicable to a silicon-on-insulator MOS field effect transistor, wherein the first and second regions correspond to the source/drain regions and the third region correspond to the channel region.

It is also available that the semiconductor thin film structure comprises a polycrystal silicon film. In this case, the above second present invention may, for example, be applicable to a silicon-on-insulator thin film transistor, wherein the first and second regions correspond to the source/drain regions and the third region correspond to the channel region.

The above refractory metal silicide layer may include at least any one of refractory metals, for example, titanium, cobalt and nickel.

The third present invention provides a silicon-on-insulator MOS field effect transistor comprising: a semiconductor substrate; an insulator layer extending on the semiconductor substrate; a silicon-on-insulator film extending directly on and in contact with a surface of the insulator layer; a gate insulation film on the channel region of the silicon-on-insulator film; a gate electrode on the gate insulation film; and side wall insulation films on side walls of the gate electrode. The silicon-on-insulator film comprises source/drain regions and a channel region positioned between the source/drain regions. Each of the source/drain regions further comprises a semiconductor material region extending directly over and in contact with the surface of the insulator layer and a refractory metal silicide layer extending directly on and in contact with the semiconductor material region. It is important for the third present invention that the refractory metal silicide layer has a first thickness which is nearly equal to or thicker than a half of a second thickness of the channel region. It is also important for the third present invention that the first thickness of the refractory metal silicide layer is further thinner than a third thickness of the source/drain regions, so that at least a majority part of a bottom surface of the refractory metal silicide layer has a junction interface with the semiconductor material region of each of the source/drain regions, thereby reducing a parasitic resistance of the source and drain regions.

Practically, it is not so easy to form a highly abrupt and exactly flat junction interface between the refractory metal silicide layer and the semiconductor material region by a silicidation reaction, for which reason the formed junction interface between the refractory metal silicide layer and the semiconductor material region might not have an extremely high abruptness and an exact flatness. In this case, the first thickness of the refractory metal silicide layer may be defined to be an averaged thickness. Even if a minority part of the bottom surface of the refractory metal silicide layer is in contact with the insulation region, then it is possible to obtain a sufficient reduction in parasitic resistance of the at least one of the source/drain regions, provided that at least the majority part of the bottom surface of the refractory metal silicide layer has a junction interface with the semiconductor material region of the at least one of the source/drain regions thereby ensuring a sufficiently large area of the junction interface. Needless to say, however, it is preferable that an entire part of the bottom surface of the refractory metal silicide layer has a junction interface with the semiconductor material region of the at least one of the source/drain regions.

The refractory metal silicide layer acts to promote drawings of second conductivity type carriers, for example, holes from the channel region, wherein the refractory metal silicide provides recombination centers for the first conductivity type carriers, for example, electrons and the second conductivity type carriers, for example, holes, when the second conductivity type carriers, for example, holes flow between the source/drain regions through the channel region. It was confirmed that, contrary to the third present invention, if the thickness of the refractory metal silicide layer is less than about a half of the thickness of the channel region, then the efficiency of drawings of the second conductivity type carriers, for example, holes from the channel region is low, whereby the second conductivity type carriers, for example, holes are likely to be accumulated in the channel region, resulting in an appearance of the kink effect. If, in accordance with the third present invention, the thickness of the refractory metal silicide layer is not less than about a half of the thickness of the channel region, then the efficiency of drawings of the second conductivity type carriers, for example, holes from the channel region is much higher than the above case, whereby the second conductivity type carriers, for example, holes are likely to be drawn from the channel region, resulting in no appearance of the kink effect.

Further, in accordance with the third aspect of the present invention, at least the majority part of the bottom surface of the refractory metal silicide layer has a junction interface with the semiconductor material region of the at least one of the source/drain regions, thereby ensuring a sufficiently large area of the junction interface. It is of course preferable that an entire part of the bottom surface of the refractory metal silicide layer has the junction interface with the semiconductor material region of the at least one of the source/drain regions. The sufficiently large area of the junction interface results in the reduction in parasitic resistance of the at least one of the source/drain regions. The reduction in parasitic resistance of the at least one of the source/drain regions allows the silicon-on-insulator MOS field effect transistor to exhibit high speed best performances.

It is available that the second and third thickness are not larger than about 50 nanometers to realize a sub-quarter micron sized silicon-on-insulator MOS field effect transistor. The above third present invention is, of course, applicable to smaller size silicon-on-insulator MOS field effect transistor than the sub-quarter micron sized silicon-on-insulator MOS field effect transistor if required in future.

The above refractory metal silicide layer may include at least any one of refractory metals, for example, titanium, cobalt and nickel.

The above silicon-on-insulator MOS field effect transistor may be either of n-channel type or p-channel type.

Figure 6:
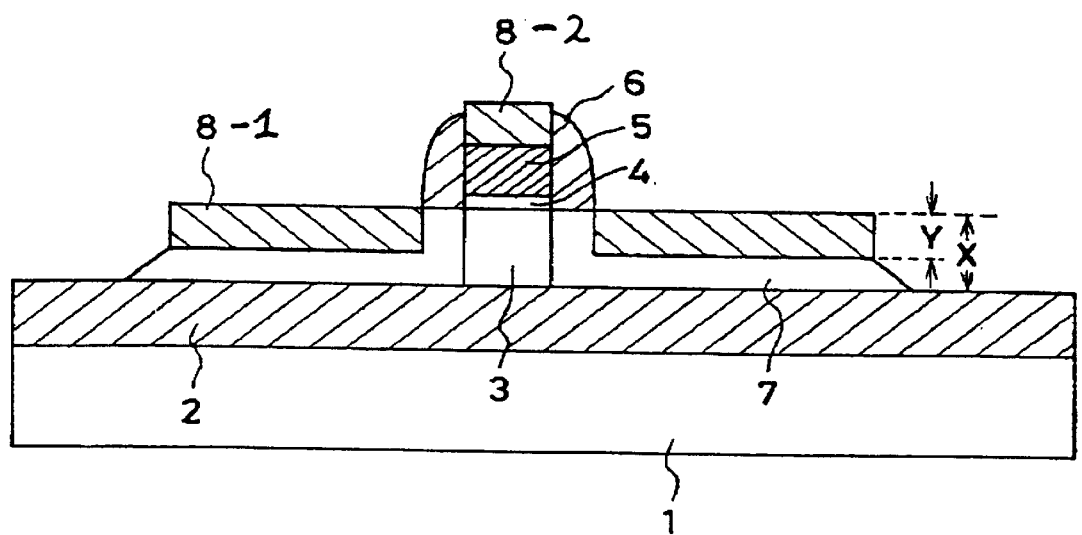
FIG. 6 is a fragmentary cross sectional elevation view illustrative of a novel sub-quarter micron sized silicon-on-insulator MOS field effect transistor in a first embodiment in accordance with the present invention.

A first embodiment according to the present invention will be described in detail with reference to FIG. 6 which is a fragmentary cross sectional elevation view illustrative of a novel sub-quarter micron sized silicon-on-insulator MOS field effect transistor. A buried oxide film 2 as an insulator is formed on a silicon substrate 1. A ultrathin silicon-on-insulator film having a sub-quarter micron thickness, for example, about 50 nanometers is formed on the buried oxide film 2, wherein the silicon-on-insulator film comprises a p⁻-type channel region 3 and n+-type source/drain regions 7 positioned opposite sides of the p⁻-type channel region 3. A gate oxide film 4 is provided on the p⁻-type channel region 3 in the silicon-on-insulator film. A polysilicon gate electrode 5 is provided on the gate oxide film 4. Titanium silicide layers 8-1 and 8-2 are provided in upper regions of the n+-type source/drain regions 7 and the polysilicon gate electrode 5. Side wall oxide films 6 are provided on opposite side walls of the polysilicon gate electrode 5 and the titanium silicide layer 8-2 on the polysilicon gate electrode 5. Under the side wall oxide films 6, the titanium silicide layers 8-1 do not extend.

The refractory metal silicide layers 8-1 have a first thickness "TY", for example, about 30 nanometers which is thicker than a half of the thickness of about 50 nanometers of the channel region 3 of the sub-quarter micron thickness silicon-on-insulator, thereby suppressing any kink effect. Further, the first thickness "Y", for example, about 30 nanometers of the refractory metal silicide layers 8-1 is further thinner than the thickness of about 50 nanometers of the source/drain regions 7 of the sub-quarter micron thickness silicon-on-insulator, so that the bottom surface of the refractory metal silicide layers 8-1 have junction interfaces with the semiconductor material region of the source/drain regions 7, thereby reducing a parasitic resistance of the source and drain regions 7.

The refractory metal silicide layers 8-1 act to promote drawings of holes from the channel region 3, wherein the refractory metal silicide provides recombination centers for electrons and holes when holes flow from the drain region through the channel region o the source region. Contrary to the present invention, if the thickness of the refractory metal silicide layers 8-1 were less than about a half of the thickness of about 50 nanometers of the channel region 3 of the sub-quarter micron thickness silicon-on-insulator, then the efficiency of drawings of holes from the channel region 3 is low, whereby holes are likely to be accumulated in the channel region 3, resulting in an appearance of the kink effect. If, in accordance with the present invention, the thickness of the refractory metal silicide layer is about 30 nanometers which is thicker than about a half of the thickness of about 50 nanometers of the channel region 3, then the efficiency of drawings of holes from the channel region 3 is much higher than the above case, whereby holes are likely to be drawn from the channel region 3, resulting in no appearance of the kink effect.

Figure 7:
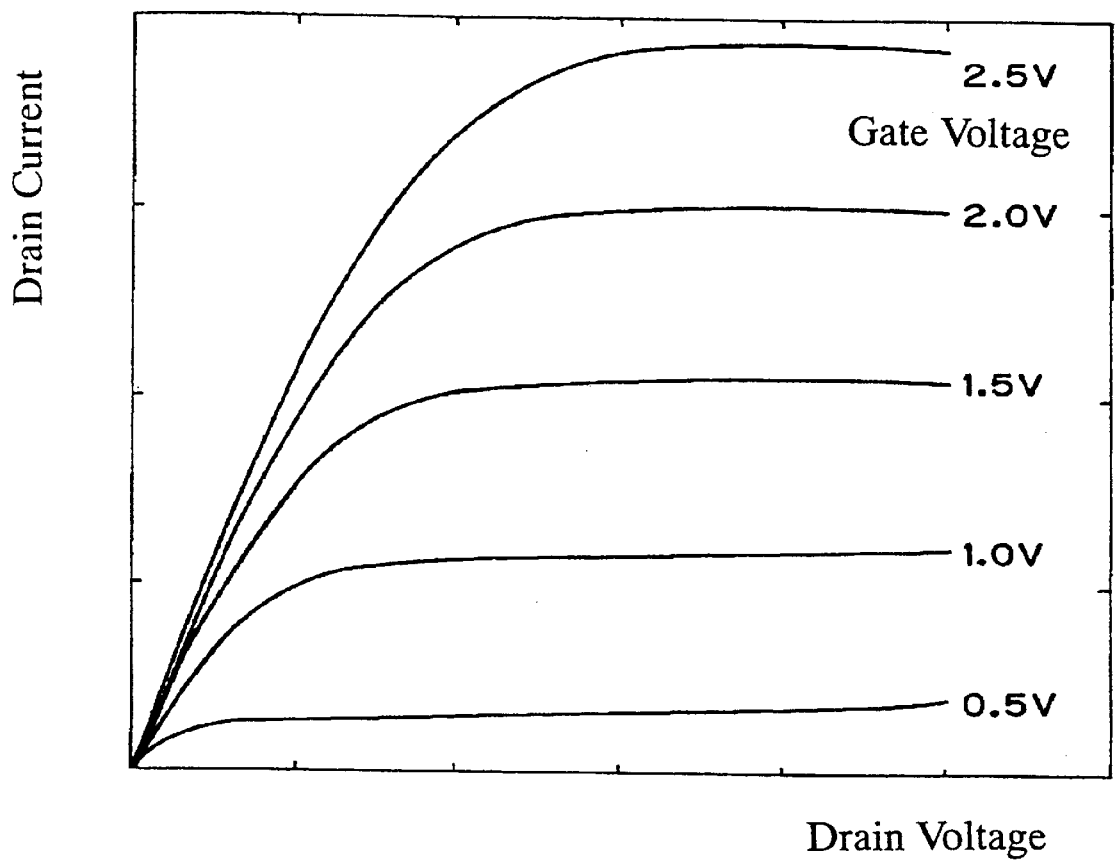
FIG. 7 is a diagram illustrative of drain current-drain voltage characteristics of a novel sub-quarter micron sized silicon-on-insulator MOS field effect transistor applied with various gate voltages of 2.5V, 2.0V, 1.5V, 1.0V and 0.5V in a first embodiment in accordance with the present invention.

FIG. 7 is a diagram illustrative of drain current-drain voltage characteristics of the novel sub-quarter micron sized silicon-on-insulator MOS field effect transistor applied with various gate voltages of 2.5V, 2.0V, 1.5V, 1.0V and 0.5V. FIG. 7 shows that the drain current-drain voltage characteristics are free from kink effects. The silicon-on-insulator structure electrically isolates or floats the sub-quarter micron sized silicon-on-insulator MOS field effect transistor from the semiconductor substrate, for which reason the increase in drain current of the sub-quarter micron sized silicon-on-insulator MOS field effect transistor causes a generation of electron-hole pairs due to impact ionization of carriers under a highly concentrated field at a junction between the drain and channel regions of the MOS field effect transistor. The electrons generated are absorbed into the drain whilst only a part of the generated holes is absorbed into the source. Notwithstanding, in accordance with the present invention, the remaining holes are drawn from the channel region into the refractory metal silicide layers 8-1 at a high efficiency without, however any hole accumulation in the channel region 3. Drawing of the holes from the channel region at the high efficiency and no accumulation of the holes in the channel region cause no increase in potential of the channel region, thereby no drop in threshold voltage of the sub-quarter micron sized silicon-on-insulator MOS field effect transistor. No drop in threshold voltage of the sub-quarter micron sized silicon-on-insulator MOS field effect transistor causes no rapid increase in the drain current of the sub-quarter micron sized silicon-on-insulator MOS field effect transistor. This means that no kink effect appears on the drain current-drain voltage characteristics of the sub-quarter micron sized silicon-on-insulator MOS field effect transistor Every drain current-drain voltage characteristics of the sub-quarter micron sized silicon-on-insulator MOS field effect transistor applied with various gate voltages of 2.5V, 2.0V, 1.5V, 1.0V and 0.5 V are free from kink effects.

On the other hand, the entire parts of the bottom surfaces of the refractory metal silicide layers 8-1 have junction interfaces with the semiconductor material regions of the source/drain regions 7, thereby ensuring a sufficiently large area of the junction interface. The sufficiently large area of the junction interface results in the reduction in parasitic resistance of the source/drain regions 7. The reduction in parasitic resistance of the source/drain regions 7 allows the sub-quarter micron sized silicon-on-insulator MOS field effect transistor to exhibit high speed best performances.

FIG. 7 also shows no reduction in drain currents of the drain current-drain voltage characteristics of the sub-quarter micron sized silicon-on-insulator MOS field effect transistor applied with the various gate voltages of 2.5V, 2.0V, 1.5V, 1.0V and 0.5V due to no parasitic resistance of the sub-quarter micron sized silicon-on-insulator MOS field effect transistor. No reductions in the drain currents in the drain current-drain voltage characteristics of the sub-quarter micron sized silicon-on-insulator MOS field effect transistor results no deterioration in the high speed performances of the sub-quarter micron sized silicon-on-insulator MOS field effect transistor The above sub-quarter micron sized silicon-on-insulator MOS field effect transistor may be formed as follows. The silicon-on-insulator film having the predetermined thin thickness is formed on the buried oxide layer 2 by a mesa isolation technique. The sub-quarter micron thickness silicon-on-insulator film having a thickness of about 50 nanometers is divided into the p$^-$-type channel region 3 and the n+-type source/drain regions 7 by selective ion-implantations of p-type and n-type impurities. The gate oxide film 4 is formed on the p$^-$-type channel region 3. An impurity doped polysilicon layer is formed over the silicon-on-insulator film before the impurity doped polysilicon layer is then patterned to define the polysilicon gate electrode 5 on the gate oxide film 4. A silicon oxide film is then deposited by a chemical vapor deposition so that the silicon oxide film extends over the polysilicon gate electrode 5 and the n+-type source/drain regions 7 in the sub-quarter micron thickness silicon-in-insulator film. An anisotropic etching to the silicon oxide film is carried out to leave the silicon oxide film only on opposite side walls of the polysilicon gate electrode 5, thereby forming the side wall oxide films 6. A titanium layer having a thickness of about 20 nanometers is deposited entirely over the polysilicon gate electrode 5, the side wall oxide films 6 and the n+-type source/drain regions 7 in the sub-quarter micron thickness silicon-in-insulator film by sputtering a titanium target. The titanium film is then subjected to a high temperature annealing at about 700° C. in an inert gas atmosphere such as a nitrogen atmosphere to cause a selective silicidation reaction of titanium with silicon over the polysilicon gate electrode 5 and the n+-type source/drain regions 7 in the sub-quarter micron thickness silicon-on-insulator film, whereby C49-structured titanium silicide layers 8-2 and 8-1 having a thickness of about 30 nanometers are selectively formed on the polysilicon gate electrode 5 and the n+-type source/drain regions 7 in the sub-quarter micron thickness silicon-on-insulator film, whilst titanium nitride layers are formed over the buried oxide layer 2 and the side wall oxide films 6. The titanium nitride layers are then removed by a wet etching. The C49-structured titanium silicide layers 8-1 and 8-2 are then subjected to a second heat treatment at about 800° C. in an inert gas atmosphere such as a nitrogen atmosphere to cause a phase transition from C49-crystal structure into C54-crystal structure, whereby C54-structured titanium silicide layers 8-2 and 8-1 are formed in the upper regions of the polysilicon gate electrode 5 and the n+-type source/drain regions 7 in the sub-quarter micron thickness silicon-on-insulator film.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor thin film structure comprising source/drain regions and a channel region positioned between said source/drain regions, said semiconductor thin film structure extending directly on and in contact with a surface of an insulation region, and at least one of said source/drain regions comprising a semiconductor material region extending directly over and in contact with said surface of said insulation region and a refractory metal silicide layer extending directly on and in contact with said semiconductor material region, wherein said refractory metal silicide layer has an average first thickness measured from an upper surface thereof to a lower surface thereof that contacts said semiconductor material region which is equal to or thicker than a half of a second thickness of said channel region, said second thickness being measured from an upper surface of said channel region to a lower surface of said channel region that contacts said surface of said insulation region, and wherein said first thickness of said refractory metal silicide layer is further thinner than a third thickness of said at least one of said source/drain regions, said third thickness being measured from an upper surface of said at least one of said source/drain regions to a lower surface thereof that contacts said surface of said insulation region, so that at least a majority part of a bottom surface of said refractory metal silicide layer has a junction interface with said semiconductor material region of said at least one of said source/drain regions.

2. The semiconductor thin film structure as claimed in claim 1, wherein each of said second and third thicknesses is not larger than about 50 nanometers.

3. The semiconductor thin film structure as claimed in claim 2, wherein said second and third thicknesses are the same as each other.

4. The semiconductor thin film structure as claimed in claim 2, wherein said second and third thicknesses are different from each other.

5. The semiconductor thin film structure as claimed in claim 1, wherein said semiconductor thin film structure comprises a single crystal silicon film to form a silicon-on-insulator structure.

6. The semiconductor thin film structure as claimed in claim 1, wherein said semiconductor thin film structure comprises a polycrystal silicon film.

7. A semiconductor thin film structure comprising first and second regions of a first conductive type and a second region of a second conductivity type positioned between said first and second regions, said semiconductor thin film structure extending directly on and in contact with a surface of an insulation region, and at least one of said first and second regions comprising a semiconductor material region extending directly over and in contact with said surface of said insulation region and a refractory metal silicide layer extending directly on and in contact with said semiconductor material region, wherein said refractory metal silicide layer has an average first thickness measured from an upper surface thereof to a lower surface thereof that contacts said semiconductor material region which is equal to or thicker than a half of a second thickness of said third region, said second thickness being measured from an upper surface of said third region to a lower surface of said third region that contacts said surface of said insulation region, and wherein said first thickness of said refractory metal silicide layer is further thinner than a third thickness of said at least one of said first and second regions, said third thickness being measured from an upper surface of said at least one of said first and second regions to a lower surface thereof that contacts said surface of said insulation region, so that at least a majority part of a bottom surface of said refractory metal silicide layer has a junction interface with said semiconductor material region of said at least one of said first and second regions.

8. The semiconductor thin film structure as claimed in claim 7, wherein each of said second and third thicknesses is not larger than about 50 nanometers.

9. The semiconductor thin film structure as claimed in claim 8, wherein said second and third thicknesses are the same as each other.

10. The semiconductor thin film structure as claimed in claim 8, wherein said second and third thicknesses are different from each other.

11. The semiconductor thin film structure as claimed in claim 7, wherein said semiconductor thin film structure comprises a single crystal silicon film to form a silicon-on-insulator structure.

12. The semiconductor thin film structure as claimed in claim 7, wherein said semiconductor thin film structure comprises a polycrystal silicon film.

13. A silicon-on-insulator MOS field effect transistor comprising:

a semiconductor substrate;

an insulator layer extending on said semiconductor substrate;

a silicon-on-insulator film extending directly on and in contact with a surface of said insulator layer, said silicon-on-insulator film comprising source/drain regions and a channel region positioned between said source/drain regions, and each of said source/drain regions further comprising a semiconductor material region extending directly over and in contact with said surface of said insulator layer and a refractory metal silicide layer extending directly on and in contact with said semiconductor material region;

a gate insulation film on said channel region of said silicon-on-insulator film;

a gate electrode on said gate insulation film; and side wall insulation films on side walls of said gate electrode, wherein said refractory metal silicide layer has an average first thickness measured from an upper surface thereof to a lower surface thereof that contacts said semiconductor material region which is equal to or thicker than a half of a second thickness of said channel region, said second thickness being measured from an upper surface of said channel region to a lower surface of said channel region that contacts said surface of said insulation region, and wherein said first thickness of said refractory metal silicide layer is further thinner than a third thickness of said source/drain regions, said third thickness being measured from an upper surface of said at least one of said source/drain regions to a lower surface thereof that contacts said surface of said insulation region, so that at least a majority part of a bottom surface of said refractory metal silicide layer has a junction interface with said semiconductor material region of each of said source/drain regions.

14. The silicon-on-insulator MOS field effect transistor as claimed in claim 13, wherein each of said second and third thicknesses is not larger than about 50 nanometers.

* * * * *